(12) United States Patent
Takashima et al.

(10) Patent No.: US 10,128,106 B2
(45) Date of Patent: Nov. 13, 2018

(54) SEMICONDUCTOR DEVICE AND MANUFACTURING METHOD OF THE SEMICONDUCTOR DEVICE

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/417,242

(22) Filed: Jan. 27, 2017

(65) Prior Publication Data

US 2017/0271148 A1    Sep. 21, 2017

(30) Foreign Application Priority Data

Mar. 15, 2016  (JP) ................................. 2016-050798

(51) Int. Cl.

| | |
|---|---|
| *H01L 21/02* | (2006.01) |
| *H01L 21/265* | (2006.01) |
| *H01L 21/324* | (2006.01) |
| *H01L 23/482* | (2006.01) |
| *H01L 29/20* | (2006.01) |
| *H01L 29/32* | (2006.01) |
| *H01L 29/66* | (2006.01) |
| *H01L 29/78* | (2006.01) |
| *H01L 29/872* | (2006.01) |
| *H01L 29/36* | (2006.01) |
| *H01L 29/06* | (2006.01) |

(52) U.S. Cl.
CPC .... *H01L 21/0254* (2013.01); *H01L 21/02389* (2013.01); *H01L 21/26546* (2013.01); *H01L 21/3245* (2013.01); *H01L 23/4827* (2013.01); *H01L 29/2003* (2013.01); *H01L 29/32* (2013.01); *H01L 29/66212* (2013.01); *H01L 29/7802* (2013.01); *H01L 29/872* (2013.01); *H01L 29/0619* (2013.01); *H01L 29/36* (2013.01)

(58) Field of Classification Search
None
See application file for complete search history.

(56) References Cited

U.S. PATENT DOCUMENTS 8,680,587 B2 * 3/2014 Henning ............. H01L 29/8611
257/155
2014/0120703 A1   5/2014 Iwami

FOREIGN PATENT DOCUMENTS

JP    2009-170604 A    7/2009

* cited by examiner

*Primary Examiner* — Jack Chen

(57) ABSTRACT

When a defect region is present near the pn junction in a GaN layer, lattice defects are present in the depletion layer. Therefore, when a reverse bias is applied to the pn junction, the defects in the depletion layer cause the generated current to flow as a leakage current. The leakage current flowing through the depletion layer can cause a decrease in the withstand voltage at the pn junction. Provided is a semiconductor device using gallium nitride, including a gallium nitride layer including an n-type region. The gallium nitride layer includes a first p-type well region and a second p-type well region that is provided on at least a portion of the first p-type well region and has a peak region with a higher p-type impurity concentration than the first p-type well region.

16 Claims, 13 Drawing Sheets

(a) AFTER ION IMPLANTATION, BEFORE ANNEALING (b) AFTER ANNEALING

SEMICONDUCTOR DEVICE AND MANUFACTURING METHOD OF THE SEMICONDUCTOR DEVICE

The contents of the following Japanese patent application are incorporated herein by reference: NO. 2016-050798 filed in JP on Mar. 15, 2016.

BACKGROUND

1. Technical Field

The present invention relates to a semiconductor device and a manufacturing method of the semiconductor device.

2. Related Art

A conventional method is known that includes ion-implantating a p-type dopant into a gallium nitride-type semiconductor film and then annealing the gallium nitride-type semiconductor film in an ammonia atmosphere, as shown in Patent Document 1, for example. Furthermore, a method is known that includes doping a gallium nitride-type semiconductor film with Mg (magnesium) along with O (oxygen), as shown in Patent Document 1, for example. Furthermore, a method is known that includes doping a GaN (gallium nitride) layer with Mg along with a metal element such as Zn (Zinc), in order to improve the activation rate of the Mg, as shown in Patent Document 2, for example.

Patent Document 1: Japanese Patent Application Publication No. 2009-170604
Patent Document 2: Japanese Patent Application Publication No. 2014-86698

Generally, a p-type GaN layer is more difficult to form than a p-type Si (silicon) layer. In order to form a p-type GaN layer in a GaN layer, there is an idea to provide a p-type region having a p-type impurity concentration greater than or equal to $1E+19$ $[cm^{-3}]$ in the GaN layer. When p-type impurities are ion-implanted into the GaN layer with a concentration of $1E+19$ $[cm^{-3}]$ or more, a large amount of lattice defects can also be introduced. If it were assumed that lattice defects are present near the pn junction in the GaN layer, lattice defects would also be present in the depletion layer. Therefore, when a reverse bias is applied to the pn junction, the lattice defects in the depletion layer cause a leakage current. The leakage current flowing through the depletion layer can cause a decrease in the withstand voltage at the pn junction.

SUMMARY

According to a first aspect of the present invention, provided is a semiconductor device using gallium nitride. The semiconductor device may comprise a gallium nitride layer. The gallium nitride layer may include an n-type region. The gallium nitride layer may include a first p-type well region and a second p-type well region. The second p-type well region may be provided on at least a portion of the first p-type well region. The second p-type well region may have a peak region with a higher p-type impurity concentration than the first p-type well region.

The peak region in the second p-type well region may have a p-type impurity concentration greater than or equal to $1E+19$ $[cm^{-3}]$.

The peak region in the second p-type well region may have a p-type impurity concentration less than $1E+21$ $[cm^{-3}]$.

The first p-type well region may include a flat region. In the flat region, a slope of a p-type impurity concentration distribution in a depth direction of the gallium nitride layer may be more gentle than a slope of a p-type impurity concentration distribution of the peak region. The flat region may have a p-type impurity concentration less than $1E+19$ $[cm^{-3}]$.

The flat region in the first p-type well region may have a p-type impurity concentration greater than or equal to $1E+16$ $[cm^{-3}]$.

A largest value of the p-type impurity concentration of the flat region in the first p-type well region may be less than or equal to half of the p-type impurity concentration of the peak region in the second p-type well region.

When an anode potential applied to the second p-type well region is less than a cathode potential applied to the n-type region, a depletion layer formed between the first p-type well region and the n-type region does not need to reach the second p-type well region.

When a critical voltage, which is a difference between the anode potential and the cathode potential when an avalanche breakdown occurs in the gallium nitride layer, is applied, the depletion layer does not need to reach the second p-type well region.

The number of lattice defects in the second p-type well region may be greater than the number of lattice defects in the first p-type well region.

The p-type impurities of the first p-type well region and the second p-type well region may include one or more types of elements from among magnesium, calcium, beryllium, and zinc.

The gallium nitride layer may have a dislocation density less than $1E+7$ $[cm^{-2}]$.

According to a second aspect of the present invention, provided is a manufacturing method of a semiconductor device using a gallium nitride layer including an n-type region. The manufacturing method of the semiconductor device may comprise first implantation, second implantation, and annealing of the gallium nitride layer performed after the first implantation and the second implantation. The first implantation may include implanting p-type impurities from a front surface of the gallium nitride layer in order to provide a first p-type well region in the gallium nitride layer. The second implantation may include implanting p-type impurities from the front surface of the gallium nitride layer with a lower acceleration voltage than in the first implantation, in order to form a peak region provided on at least a portion of the first p-type well region and having a higher p-type impurity concentration than the first p-type well region.

The manufacturing method of the semiconductor device may further comprise third implantation. The third implantation may be performed before the annealing of the gallium nitride layer and before or after the first implantation and the second implantation. The third implantation may include implanting an element different from n-type impurities and p-type impurities from the front surface of the gallium nitride layer.

The third implantation may include implanting the element different from n-type impurities and p-type impurities with a different profile than in the first implantation and the second implantation.

The element implanted in the third implantation may be at least one of a group 15 element and a group 18 element.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

The behavior of p-type impurities in an Si layer is well known. After p-type impurities are ion-implanted into the Si layer, the Si layer is usually annealed in order to activate the impurities and repair the lattice defects. Furthermore, it is known that during the annealing, the p-type impurities that have been ion-implanted into the Si layer diffuse within the Si layer.

In contrast to this, after the p-type impurities have been ion-implanted into the GaN layer, when the GaN layer is annealed, it is not known that the p-type impurities that have been ion-implanted diffuse within the GaN layer. The p-type impurities for the Si layer and the p-type impurities for the GaN layer are different elements. The inventors of the invention in the present application confirmed the fact that the p-type impurities implanted into the GaN layer diffuse within the GaN layer during annealing. Specifically, the inventors of the invention of the present application confirmed that the p-type impurities that have been ion-implanted move in a manner to be focused at a region where crystallinity is not recovered even after annealing. Furthermore, it was confirmed that crystallinity is recovered after annealing in a region having a p-type impurity concentration that is lower than a prescribed p-type impurity concentration.

Figure 1:
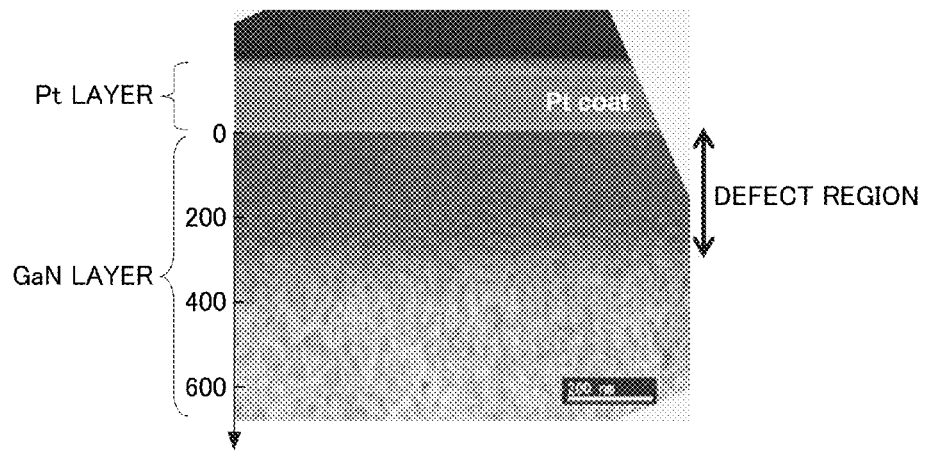
FIG. 1 shows a first experimental example, in which image (a) shows a TEM observation image of a cross section near a front surface of a GaN layer before annealing, after Mg ions have been implanted from the front surface of the GaN layer and image (b) shows a TEM observation image of a cross section near the front surface of the GaN layer after annealing.
Figure 1:
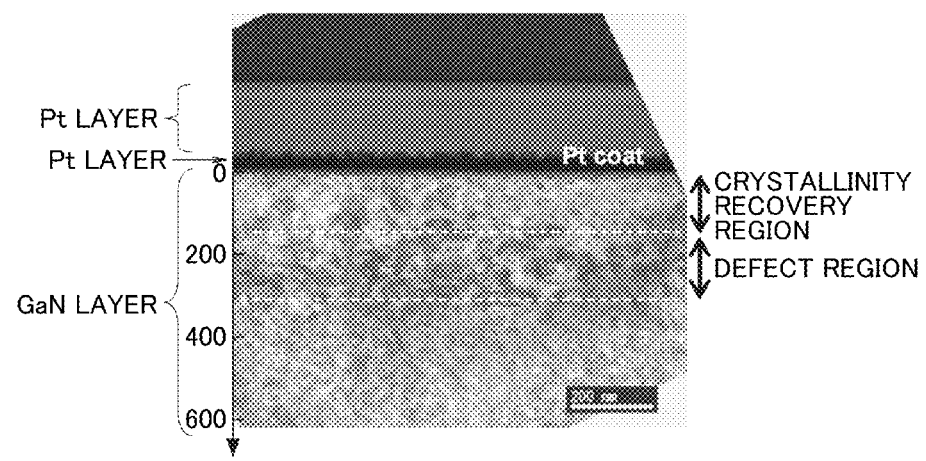

FIG. 1 shows a first experimental example. In FIG. 1, image (a) shows a TEM observation image of a cross section near a front surface of a GaN layer before annealing, after Mg ions have been implanted from the front surface of the GaN layer. In FIG. 1, image (b) shows a TEM observation image of a cross section near the front surface of the GaN layer after annealing. Both image (a) and image (b) of FIG. 1 show a range to a depth of approximately 600 [nm] in a depth direction from the front surface of the GaN layer. The Pt (platinum) layer provided on the front surface of the GaN layer shown in image (a) and image (b) of FIG. 1 is a layer formed to protect the front surface when manufacturing a sample for TEM observation, and is not directly related to this experimental example.

Figure 2:
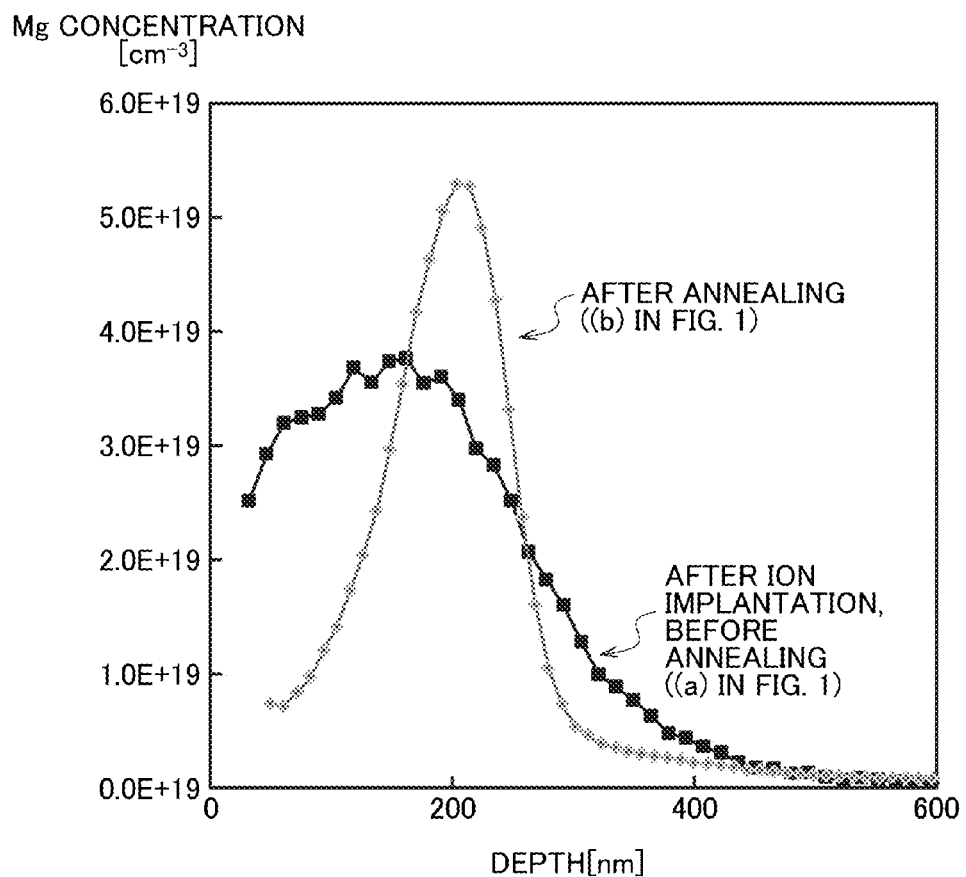
FIG. 2 shows an Mg concentration profile downward from the front surface in the images (a) and (b) of FIG. 1.

In the present example, Mg ions were implanted from the front surface of the GaN layer. In the present example, Mg was ion-implanted such that the p-type impurity concentration in the GaN layer was constant at 4E+19 [cm$^{-3}$] in a range from the front surface (depth of 0 [nm]) to a depth of approximately 200 [nm]. It should be noted that, in the GaN layer after the implantation, an impurity concentration peak was formed in a range from a depth of approximately 130 [nm] to a depth of approximately 170 [nm], as shown in FIG. 2 described further below. As a result of the ion implantation, Mg is implanted into the GaN layer and a defect region is formed to a depth of approximately 300 [nm] from the front surface of the GaN layer. Here, E means 10 raised to a certain power, e.g. 1E+16 means $1 \times 10^{16}$.

In the present example, after the Mg has been ion-implanted from the front surface of the GaN layer and before the GaN layer is annealed, an AlN (aluminum nitride) layer is deposited on the front surface as a surface protection film for annealing, and the AlN layer is removed after the annealing using a wet process with an alkali solvent. In the present example, a direction from the GaN layer toward the Pt layer shown in image (b) of FIG. 1 is referred to as "up" for the sake of convenience, and the opposite direction is referred to as "down" for the sake of convenience. Furthermore, in the present example, the surface of the GaN layer contacting the Pt layer shown in image (b) of FIG. 1 is referred to as the "front surface" of the GaN layer. A prescribed position below the front surface of the GaN layer is referred to as a "depth" of the GaN layer.

Image (b) in FIG. 1 shows a state in which the layered body shown in image (a) of FIG. 1 was annealed at approximately 1,300 [° C.]. As can be seen in image (b) of FIG. 1, in the present example where Mg has been implanted into the GaN layer with a concentration greater than or equal to 1E+19 [cm$^{-3}$], the lattice defects are not completely repaired even when annealing is performed at approximately 1,300 [° C.]. In the present example, the defect region refers to a region where lattice defects are present. During the ion implantation, the implanted ions lose energy while colliding with the lattice in the crystal, but it is known that when this happens the elements forming the crystal lattice exhibit a domino effect, whereby more lattice defects occur at positions deeper than the position of the peak concentration of the implanted ions. As shown in image (b) of FIG. 1, lattice defects particularly remain in a range from a depth greater than or equal to 200 [nm] to a depth less than or equal to approximately 300 [nm] even after the annealing. In contrast, crystallinity is almost recovered at depths above approximately 200 [nm] and depths below approximately 300 [nm].

FIG. 2 shows an Mg concentration profile downward from the front surface in the images (a) and (b) of FIG. 1. The vertical axis shows the Mg concentration [cm$^{-3}$]. The horizontal axis shows the depth [nm], with the front surface being 0 [nm]. The profile with the relatively gentle slope in FIG. 2 corresponds to image (a) in FIG. 1. In contrast, the profile with the relatively steep slope in FIG. 2 corresponds to image (b) in FIG. 1.

As shown in FIG. 2, the impurity concentration peak that was at a position at a depth from approximately 130 [nm] to approximately 170 [nm] before the annealing is shifted to a position at a depth of approximately 200 [nm] after the annealing. Furthermore, the peak was approximately $3.8E+19$ [cm$^{-3}$] before the shift, but increased to approximately $5.3E+19$ [cm$^{-3}$] after the shift.

Depths in a range from approximately 200 [nm] to approximately 300 [nm] is a region where a significant amount of lattice defects remain even after the annealing. In this way, it was confirmed that the p-type impurities in the GaN layer were moved to be focused in the defect region as a result of the annealing. Furthermore, the Mg concentration was reduced at depths shallower than approximately 200 [nm] and deeper than approximately 300 [nm], where the defects were repaired.

Figure 3A:
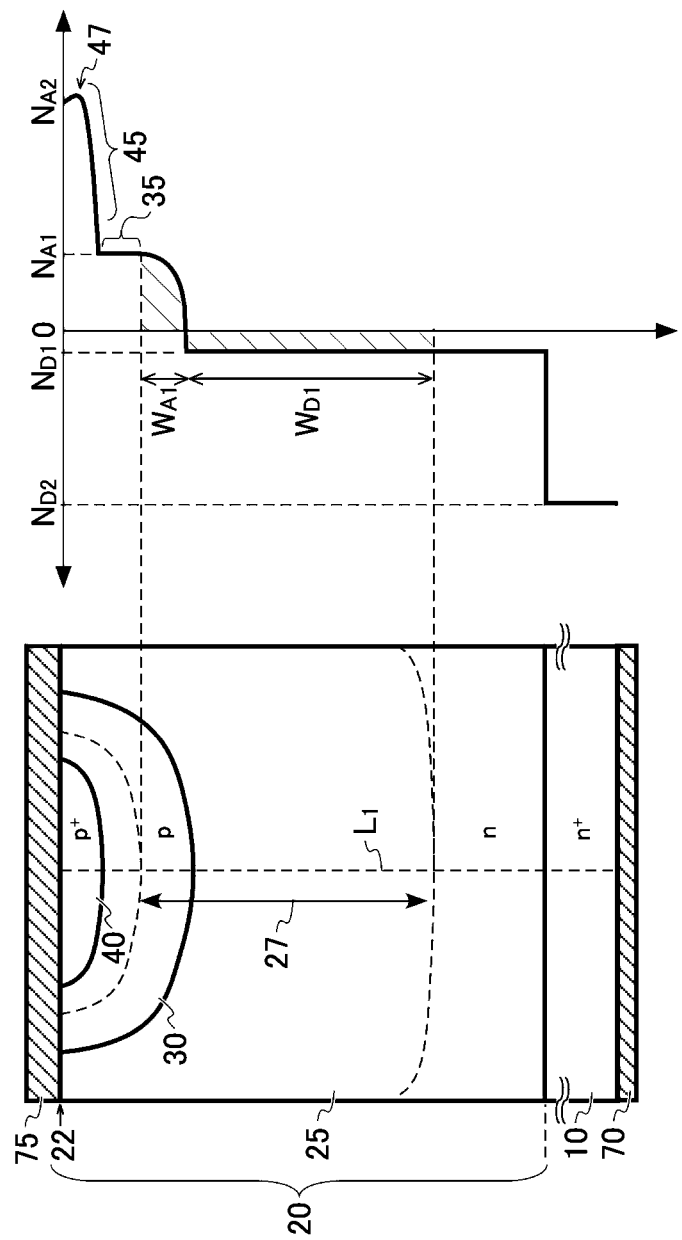
FIG. 3A schematically shows a cross section of the essential components of a JBS diode 100 according to a first embodiment and a corresponding concentration profile.

FIG. 3A schematically shows a cross section of the essential components of a JBS diode (Junction Barrier Schottky Diode) 100 according to a first embodiment and a corresponding concentration profile. In the present example, "n" and "p" refer respectively to the majority of carriers being electrons and the majority of carriers being holes. Furthermore, the "+" and "−" signs written to the upper right of "n" and "p" respectively mean that the carrier concentration is higher than in a case where a "+" sign is not written and that the carrier concentration is lower than in a case where a "−" sign is not written.

As shown in the left side of FIG. 3A, the JBS diode 100 of the present example includes an n$^+$-type GaN substrate 10 and a GaN layer 20. The n$^+$-type GaN substrate 10 may be an n$^+$-type GaN single-crystal substrate. The n$^+$-type GaN substrate 10 may include n-type impurities with a concentration from $1E+17$ [cm$^{-3}$] to $1E+20$ [cm$^{-3}$]. The thickness of the n$^+$-type GaN substrate 10 may be from 100 [μm] to 500 [μm]. In the drawings, to make for easier viewing, a portion of the n$^+$-type GaN substrate 10 in the thickness direction is omitted.

The GaN layer 20 in the present example includes an n-type region 25 formed epitaxially using MOCVD on the n$^+$-type GaN substrate 10. The n-type region 25 may include n-type impurities with a concentration of approximately $1E+16$ [cm$^{-3}$]. The thickness of the n-type region 25 may be 10 [μm]. The n-type impurities used for the GaN may be one or more types of elements from among Si (silicon), Ge (germanium), and O (oxygen). It should be noted that the n-type impurities in the present example are Si.

In the present example, a direction from the n$^+$-type GaN substrate 10 toward the GaN layer 20 is referred to as "up" for the sake of convenience, and the opposite of this direction is referred to as "down" for the sake of convenience. The surface of the GaN layer 20 contacting the anode electrode 75 is referred to as the front surface 22 of the GaN layer 20. A prescribed position below the front surface 22 of the GaN layer 20 is referred to as depth of the GaN layer 20.

The GaN layer 20 in the present embodiment includes a p-type well region 30 serving as a first p-type well region and a p$^+$-type well region 40 serving as a second p-type well region, which are formed by the ion implantation. The p-type impurities of the p-type well region 30 and the p$^+$-type well region 40 may include one or more types of elements from among Mg (magnesium), Ca (calcium), Be (beryllium), and Zn (zinc). It should be noted that the p-type impurities in the present example are Mg.

The p-type well region 30 may be provided at a position at a depth that is no less than 300 [nm] and no more than 500 [nm] from the front surface 22. In one example, the p-type well region 30 may have a p-type impurity concentration of approximately $1E+17$ [cm$^{-3}$]. Although p-type impurities are introduced to the p-type well region 30 through ion implantation, the p-type impurity concentration of the p-type well region 30 is less than $1E+19$ [cm$^{-3}$], and therefore the defect density is small enough to be repaired by the annealing.

The p$^+$-type well region 40 is provided on at least a portion of the p-type well region 30. In the present example, the p-type well region 30 is positioned around and below the p$^+$-type well region 40. The p$^+$-type well region 40 may be provided at a position at a depth that is no less than 10 [nm] and no more than 100 [nm] from the front surface 22. In one example, the p$^+$-type well region 40 may have a p-type impurity concentration greater than or equal to $1E+19$ [cm$^{-3}$]. It should be noted that p-type impurities are introduced to the p$^+$-type well region 40 through ion implantation, and therefore the defect density is higher in the p$^+$-type well region 40 than in the p-type well region 30.

The anode electrode 75 is provided on the front surface 22. The anode electrode 75 in the present example is a layered structure including an Ni (nickel) layer that directly contacts the front surface 22 and an Au (gold) layer provided on the Ni layer. The cathode electrode 70 is provided below the n$^+$-type GaN substrate 10. The cathode electrode 70 in the present embodiment is a layered structure including a Ti (titanium) layer that directly contacts the n$^+$-type GaN substrate 10 from below and an Al (aluminum) layer that is provided below the Ti layer.

The JBS diode 100 in the present example includes a pn junction formed between the n-type region 25 and the p-type well region 30 and a Schottky junction formed between the n-type region 25 and the anode electrode 75. In the present embodiment, an alloy region formed by a reaction between the p$^+$-type well region 40 and the anode electrode 75 is formed by the annealing performed when forming the anode electrode 75. This alloy region may occupy a region up to a depth of at most 50 [nm] downward from the front surface 22 of the p$^+$-type well region 40. This alloy region has a resistance that is low enough to be regarded as an ohmic contact region.

The p-type well region 30 in the present example has a p-type impurity concentration that is sufficiently lower than that of the p$^+$-type well region 40, and therefore has a sufficiently lower defect density than the p$^+$-type well region 40. The pn junction is formed by the n-type region 25 and the p-type well region 30, and therefore the number of lattice defects in the depletion layer can be made lower than in a case where the pn junction is formed by the n-type region 25 and the p$^+$-type well region 40. Therefore, it is possible to reduce the leakage current when a reverse bias is applied to the pn junction while realizing ohmic contact between the p$^+$-type well region 40 and the anode electrode 75, and to improve the withstand voltage at the pn junction.

The range of the depletion layer 27 when the reverse bias is applied to the JBS diode 100 is shown by dotted lines. The depletion layer 27 is formed between the p-type well region 30 and the n-type region 25. A case of applying the reverse bias refers to a case where an anode potential applied from the anode electrode 75 to the p$^+$-type well region 40 is lower than a cathode potential applied from the cathode electrode 70 to the n-type region 25 via the n$^+$-type GaN substrate 10. One end of the depletion layer 27 in the present example is positioned in the p-type well region 30, and the other end of the depletion layer 27 is positioned in the n-type region 25. The p-type impurity concentration may be set such that the one end of the depletion layer 27 does not reach the p$^+$-type well region 40 where there are many lattice defects.

The range of the depletion layer 27 shown on the left side of FIG. 3A may be the widening of the depletion layer 27 when avalanche breakdown occurs in the GaN layer 20 due to the electric field strength inside the depletion layer 27 reaching a critical electric field strength. In the present example, the difference between the anode potential and the cathode potential when an avalanche breakdown occurs is referred to as the critical voltage. Even when an avalanche breakdown occurs, the depletion layer 27 does not reach the p$^+$-type well region 40, and therefore it is possible to reduce the leakage current occurring when a reverse bias is applied and to improve the withstand voltage at the pn junction, compared to the example shown in FIG. 3B, which is described further below.

The right side in FIG. 3A shows the impurity concentration distribution of the JBS diode 100 in the present example. In order to simplify the description, the graph on the right side in FIG. 3A is the impurity concentration distribution at the dotted line $L_1$ passing through the deepest position of the p-type well region 30 and the p$^+$-type well region 40. On the right side in FIG. 3A, the portion of the horizontal axis to the right of the zero point shows the effective acceptor concentration [cm$^{-3}$] in the p-type well region 30 and the p$^+$-type well region 40, obtained by subtracting the donor concentration $N_D$ from the acceptor concentration $N_A$. Furthermore, $N_{A2}$ indicates the effective acceptor concentration of the p$^+$-type well region 40 in the peak position 47. Yet further, $N_{A1}$ indicates the effective acceptor concentration of the p-type well region 30 at the interface between the p-type well region 30 and the p$^+$-type well region 40.

In contrast to this, on the right side of FIG. 3A, the portion of the horizontal axis to the left of the zero point shows the effective donor concentration [cm$^{-3}$] of the n-type region 25 and the n$^+$-type GaN substrate 10, obtained by subtracting the acceptor concentration $N_A$ from the donor concentration $N_D$. Furthermore, $N_{D1}$ indicates the effective donor concentration of the n-type region 25, which is substantially constant. Yet further, $N_{D2}$ indicates the effective donor concentration of the n$^+$-type GaN substrate 10, which is substantially constant. The vertical axis indicates the depth [nm], with the front surface 22 being the zero point.

The length of the depletion layer 27 in the p-type well region 30 in the depth direction is $W_{A1}$ and the length of the depletion layer 27 in the n-type region 25 in the depth direction is $W_{D1}$. In the depletion layer 27, the number of donors and the number of acceptors match, and therefore the relationship $W_{A1} \cdot N_{A1} = W_{D1} \cdot N_{D1}$ is satisfied.

The p$^+$-type well region 40 in this example has a p-type impurity concentration greater than or equal to 1E+19 [cm$^{-3}$], and therefore has more lattice defects than the p-type well region 30. Having more lattice defects means that the lattice defect density is higher. If it impossible for the measurement to distinguish between lattice defects and other defects, e.g. linear defects, the overall defect density including both the lattice defects and the other defects is defined as being higher in the p$^+$-type well region 40 than in the p-type well region 30.

The p$^+$-type well region 40 in the present example includes a peak region 45. The peak region 45 in the present example is a region from the peak position 47 of the p-type impurity concentration to the interface between the p-type well region 30 and the p$^+$-type well region 40. The peak region 45 has a higher p-type impurity concentration than the p-type well region 30. The peak region 45 in the present example has a p-type impurity concentration greater than or equal to 1E+19 [cm$^{-3}$] and less than 1E+21 [cm$^{-3}$]. Since the p-type impurities are introduced with such a high concentration using ion implantation, lattice defects that are not repaired even after annealing are introduced into the p$^+$-type well region 40. Therefore, there are benefits that the p$^+$-type well region 40 can have a p-type impurity concentration that is even higher after the annealing than when Mg ion implantation is performed, resulting a realization of high hole concentration and ohmic contact formation.

In GaN, caution must be used such that the p-type impurity concentration, the acceptor concentration, and the hole concentration do not completely match. The acceptor concentration becomes equal to the p-type impurity concentration when the p-type impurities introduced into the crystal are all located at correct crystal positions. When p-type impurities do not enter into correct crystal positions, these p-type impurities do not function as acceptors. Also, it is known that when H (hydrogen) in the crystal and the p-type impurity atoms bond, the p-type impurities do not function as acceptors. Furthermore, in GaN, when the p-type impurities are Mg, for example, the acceptor level is deep at approximately 240 meV, and therefore not all of the acceptors are necessarily completely ionized to create holes when near room temperature. Therefore, the hole concentration becomes lower than the p-type impurity concentration by approximately one or two orders of magnitude, and it is necessary to have a p-type impurity concentration of 1E+19 [cm$^{-3}$] or more in order to obtain a high hole concentration of 1E+17 [cm$^{-3}$] or more. Each profile of the p-type impurity concentration, the acceptor concentration, and the hole concentration may be thought of as having a correlated magnitude relationship in regions other than the pn junction region.

In contrast, the p-type well region 30 in the present example has the flat region 35 in which the slope of the p-type impurity concentration distribution in the depth direction is more gentle than in the peak region 45. The flat region 35 may be a region from the interface between the p-type well region 30 and the p$^+$-type well region 40 to the interface between the p-type well region 30 and the n-type region 25. It should be noted that, in order to simplify the description, the flat region 35 in the present example may be a region in which the acceptor concentration is substantially constant, i.e. the regions other than the region near the pn junction in the p-type well region 30. In the present example, the flat region 35 is divided in half in the length from the interface between the p-type well region 30 and the p$^+$-type well region 40 to the interface between the p-type well region 30 and the n-type region 25, with the interface between the p-type well region 30 and the p$^+$-type well region 40 as an origin point.

The flat region 35 in the present embodiment has a p-type concentration that is greater than or equal to 1E+16 [cm$^{-3}$] and less than 1E+19 [cm$^{-3}$]. The largest value of the p-type impurity concentration of the flat region 35 may be less than or equal to half of the p-type impurity concentration of the peak region 45. The flat region 35 may have a p-type impurity concentration that is greater than or equal to 5E+16 [cm$^{-3}$] and less than or equal to 5E+18 [cm$^{-3}$]. In this way, by setting the flat region 35 to have a lower concentration than the p$^+$-type well region 40, it is possible to reduce the number of lattice defects in the p-type well region 30 after annealing to be lower than the number of lattice defects in the p$^+$-type well region 40.

In the present example as well, the slope of the flat region 35 is more gentle than the slope of the peak region 45. The slope of each concentration distribution in the present example refers to the absolute value of the slope of a graph of the logarithmic value of the concentration distribution in a case where the depth direction is the x axis and the logarithmic value of the p-type impurity concentration is the y axis. The slope of the logarithmic value of the concentration distribution may be (A) the slope of the logarithmic value of the concentration distribution at a prescribed position. Alternatively, the slope of the logarithmic value of the concentration distribution may be (B) the average slope of the logarithmic value of the concentration distribution in a prescribed range. Instead, the slope of the logarithmic value of the concentration distribution may be (C) the amount of change of the logarithmic value of the concentration distribution in a prescribed range. If one of the representations of (A) to (C) are used, the slope of the flat region 35 being more gentle than the slope of the peak region 45 may be expressed as shown below.

In case (A), the slope of the concentration distribution at a position that is a length of 1/N from the interface between the p-type well region 30 and the p$^+$-type well region 40 to the interface between the p-type well region 30 and the n-type region 25 may be less than the slope of the concentration distribution at a position that is a length 1/N' from the p-type impurity concentration peak position 47 to the interface between the p-type well region 30 and the p$^+$-type well region 40, with the interface between the p-type well region 30 and the p$^+$-type well region 40 as the origin point. Here, N and N' may each be a natural number greater than or equal to 2.

In case (B), the average value of the slope of the concentration distribution in half of the length from the interface between the p-type well region 30 and the p$^+$-type well region 40 to the interface between the p-type well region 30 and the n-type region 25 may be less than the slope of the concentration distribution in the length from the p-type impurity concentration peak position 47 to the interface between the p-type well region 30 and the p$^+$-type well region 40, with the interface between the p-type well region 30 and the p$^+$-type well region 40 as the origin point.

In case (C), the amount of change in the logarithmic value of the concentration in a range that is half the length from the interface between the p-type well region 30 and the p$^+$-type well region 40 to the interface between the p-type well region 30 and the n-type region 25 may be less than the amount of change in the logarithmic value of the concentration in a range that is the length from the p-type impurity concentration peak position 47 to the interface between the p-type well region 30 and the p$^+$-type well region 40, with the interface between the p-type well region 30 and the p$^+$-type well region 40 as the origin point.

As another representation of the slope of the concentration distribution of the flat region 35 being more gentle than the slope of the concentration distribution of the peak region 45, the peak region 45 and the flat region 35 may be non-continuously connected at a position excluding the interface between the p-type well region 30 and the p$^+$-type well region 40. Excluding the position of the interface between the p-type well region 30 and the p$^+$-type well region 40 means excluding a case where these regions are continuous when viewed at a micro level even though the regions appear non-continuous when viewed at a macro level.

The GaN layer 20 may have a dislocation density less than 1E+7 [cm$^{-2}$]. In this way, the effect of linear dislocations at the pn junction between the n-type region 25 and the p-type well region 30 is low enough to be ignored. Therefore, in the present example, only the effect of lattice defects needs to be considered. In this Specification, a dislocation refers to a linear defect, and a lattice defect refers to a point defect.

Figure 3B:
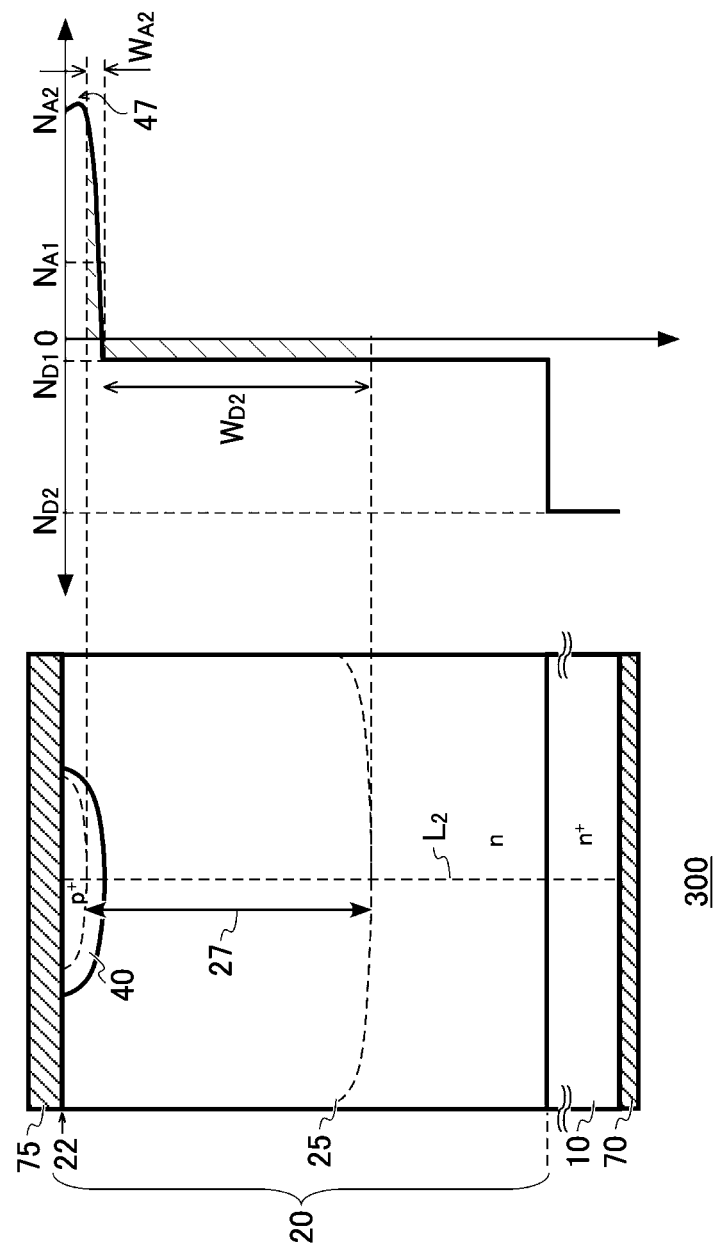
FIG. 3B schematically shows a cross section of the essential portions of a JBS diode 300 according to a comparative example and a corresponding concentration profile.

FIG. 3B schematically shows a cross section of the essential portions of a JBS diode 300 according to a comparative example and a corresponding concentration profile. As shown in the left side of FIG. 3B, the JBS diode 300 of the comparative example does not include the p-type well region 30. The JBS diode 300 differs from the JBS diode 100 with regard to this point. In the JBS diode 300, one end of the depletion layer 27 reaches the p$^+$-type well region 40 where there are many lattice defects. Therefore, a leakage current occurs in the JBS diode 300 when the reverse bias is applied. Accordingly, the withstand voltage of the JBS diode 300 is lower than that of the JBS diode 100. The impurity concentration distribution of the JBS diode 300 is shown on the right side of FIG. 3B for reference.

Figure 4:
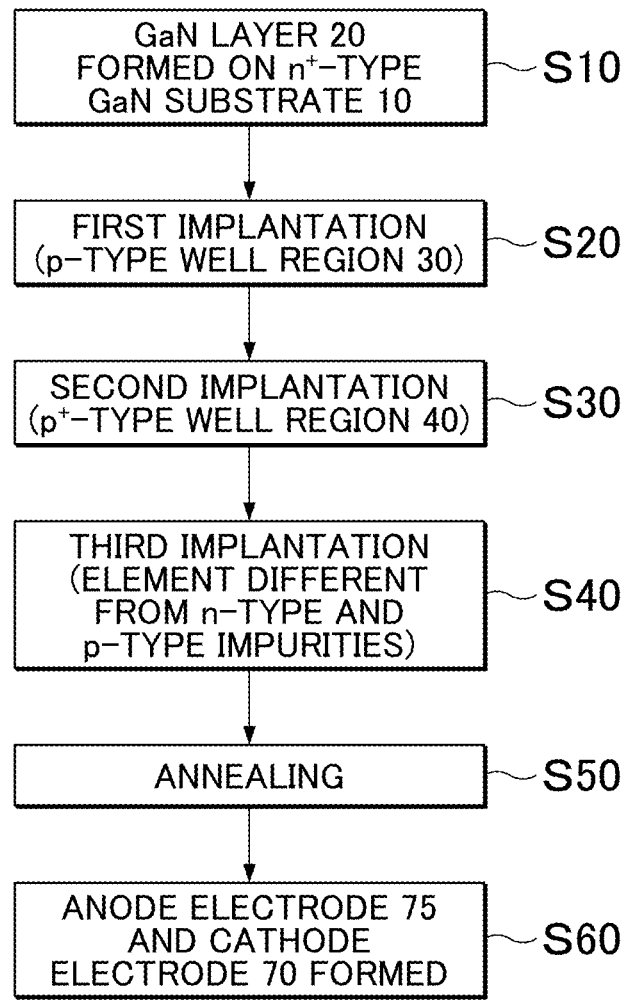
FIG. 4 shows a manufacturing method 200 of the JBS diode 100.

FIG. 4 shows a manufacturing method 200 of the JBS diode 100. The manufacturing method 200 in the present example includes steps from step S10 to step S60. In the present example, steps S10 to S60 are performed in this order.

Figure 5A:
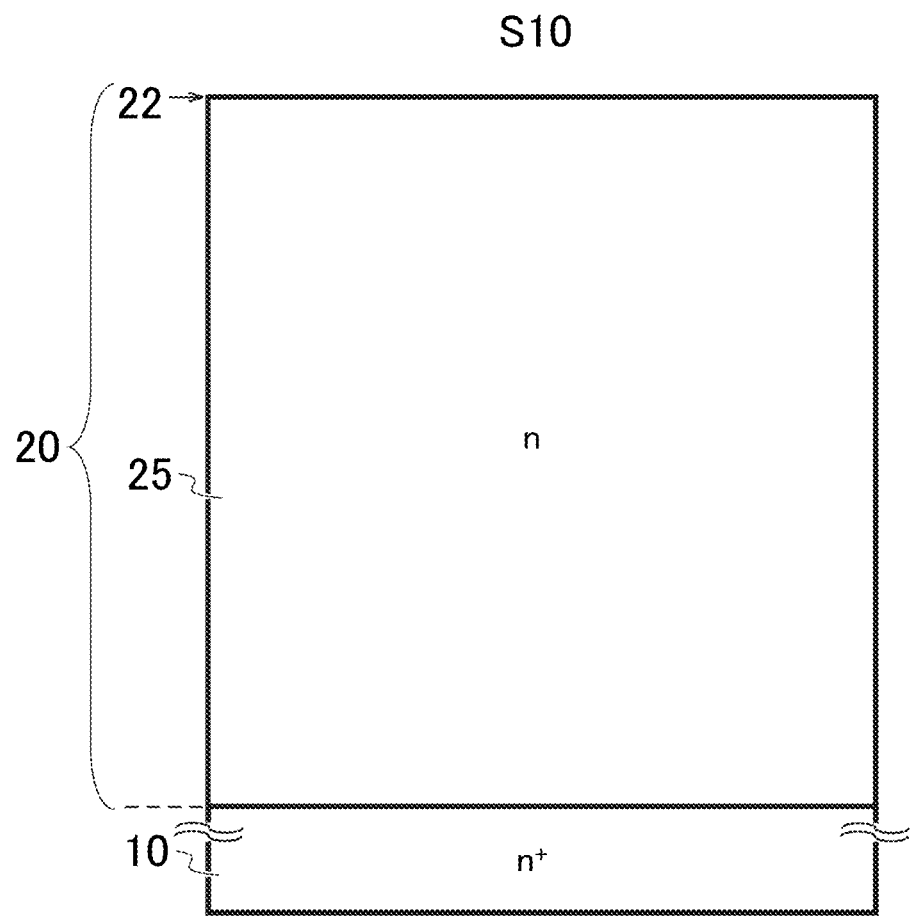
FIG. 5A shows step S10.

FIG. 5A shows step S10. In step S10, the GaN layer 20 is epitaxially formed on the n$^+$-type GaN substrate 10 using MOCVD. In this step, the GaN layer 20 includes only the n-type region 25.

Figure 5B:
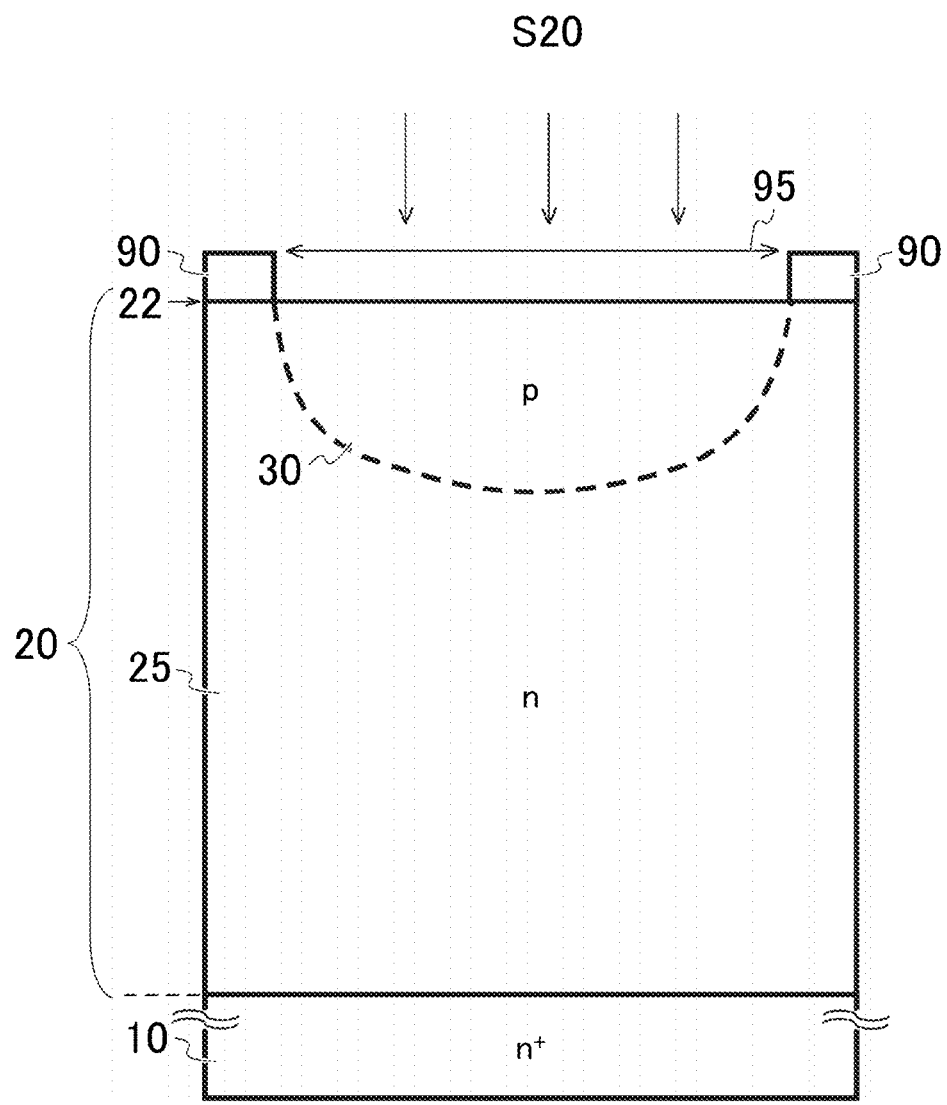
FIG. 5B shows step S20.

FIG. 5B shows step S20. In the present example, in step S20 serving as a first implantation step, Mg is ion-implanted into the GaN layer 20 from the front surface 22 of the GaN layer 20 through openings 95 in a resist mask 90. In the present example, the Mg is ion-implanted with a dose amount of 6E+12 [cm$^2$] through multi-stage implantation with acceleration voltages of 40, 70, 110, 150, 200, 250, and 430 [keV]. In this way, after the annealing of step S50, it is possible to provide the p-type well region 30 on the GaN layer 20 with an impurity concentration of 1E+17 [cm$^{-3}$]. The ion implantation region before the annealing and after the ion implantation is shown by dotted lines. The range shown by the dotted lines in FIG. 5B is the region that becomes the p-type well region 30 after the annealing.

In the present example, in order to form the p-type well region 30, Mg is ion-implanted into the n-type region 25. However, as another example, the n-type region 25 may be partially removed and p-type GaN may be epitaxially grown as the p-type well region 30 using MOCVD in the region from which the n-type region 25 was removed.

Figure 5C:
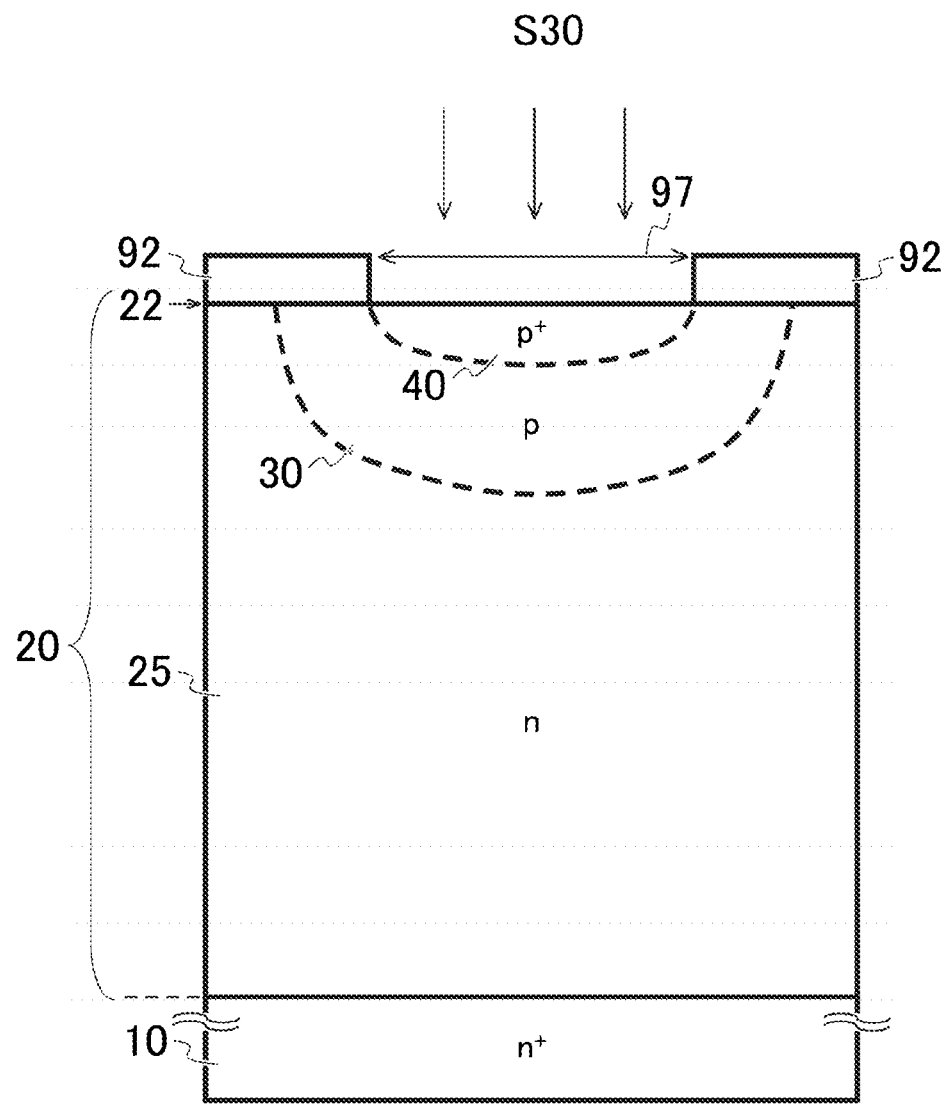
FIG. 5C shows step S30.

FIG. 5C shows step S30. In the present example, in step S30 serving as a second implantation step, Mg is ion-implanted with a lower acceleration voltage than in step S20 from the front surface 22 of the GaN layer 20, through openings 97 in a resist mask 92. The resist mask 92 includes the openings 97 that have a smaller area than the openings 95 in the resist mask 90. In the present example, Mg is ion-implanted with an acceleration voltage of 10 [keV] and a dose amount of 4.5E+13 [cm$^2$]. In this way, after the annealing of step S50, it is possible to provide the p$^+$-type well region 40 with an impurity concentration of 2E+19 [cm$^{-3}$] on the GaN layer 20.

In the present embodiment, the dose concentration of the p-type impurities in step S30 is higher than the dose concentration of the p-type impurities in step S20. It should be noted that the dose concentration of the p-type impurities in step S30 may be set to be less than or equal to dose concentration of the p-type impurities in step S20. In this other example, defects may be introduced into the region that will become the p⁺-type well region 40 after the annealing, by using step S40 described further below. In this way, it is possible to make the p-type impurity concentration of the p⁺-type well region 40 higher than that of the p-type well region 30 after the annealing. In the same manner as in FIG. 5B, the ion implantation region before the annealing and after the ion implantation is shown with dotted lines. The range shown by the dotted lines in FIG. 5C is the region that becomes the p-type well region 30 and the p⁺-type well region 40 after the annealing.

Figure 5D:
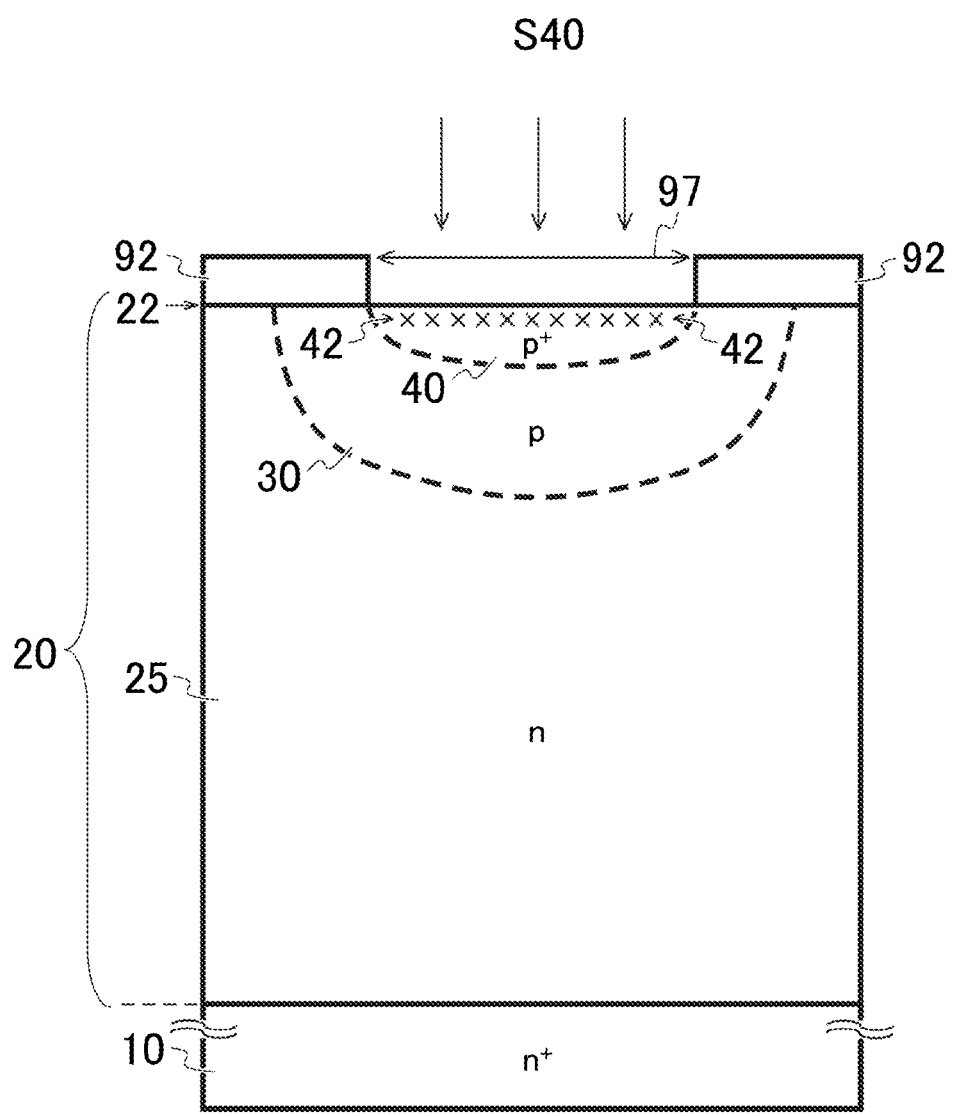
FIG. 5D shows step S40.

FIG. 5D shows step S40. Step S40 is performed in the present example, but in another example step S40 may be omitted. Furthermore, step S40 may be performed before step S30. In the present example, in step S40 serving as a third implantation step, elements differing from the n-type impurities and p-type impurities are implanted into the GaN from the front surface 22 of the GaN layer 20.

The elements implanted in step S40 are implanted with a different profile than in step S20 and step S30. In the present example, the resist mask 92 is used to form the defect region 42 near the front surface 22 of the p⁺-type well region 40. The defect region 42 is not provided in the p-type well region 30, and is only provided in the p⁺-type well region 40. Therefore, it is possible to further increase the p-type impurity concentration of the p⁺-type well region 40 after annealing compared to a case where the defect region 42 is not formed, without introducing defects into the p-type well region 30. Increasing the p-type impurity concentration of the p⁺-type well region 40 is beneficial for forming ohmic contact.

Since the p-type well region 30 and the p⁺-type well region 40 are formed using ion implantation in the present example, an existing ion implantation apparatus can be used. This is beneficial because it is possible to use the same apparatus as is used for an existing silicon process.

The defect region 42 may be shallower than the peak position 47 shown in FIG. 3A. Instead, in another example, the defect region 42 may be deeper than the peak position 47 and shallower than the interface between the p-type well region 30 and the p⁺-type well region 40. In the present example, the Ar⁺ is ion-implanted with an acceleration voltage of 10 [keV] and a dose amount of 1E+13 [cm⁻²].

The element implanted in step S40 may be at least one of a group 15 and a group 18 element. The group 18 element may be Ar (argon) and Ne (neon). The group 18 element is an inert element that does not act as an n-type or p-type impurity. By implanting the group 18 element, it is possible to increase the defect density.

The group 15 element may be N (nitrogen), P (phosphorous), and As (arsenic). The group 15 element has the same valency as the N in the GaN layer 20, and therefore does not act as an n-type or p-type impurity. By implanting the group 15 element, it is possible to increase the defect density. In addition, the group 15 element can bury N vacancies in the GaN material, and therefore it is possible to increase the activation rate of the p-type impurities after the annealing of step S50.

Figure 5E:
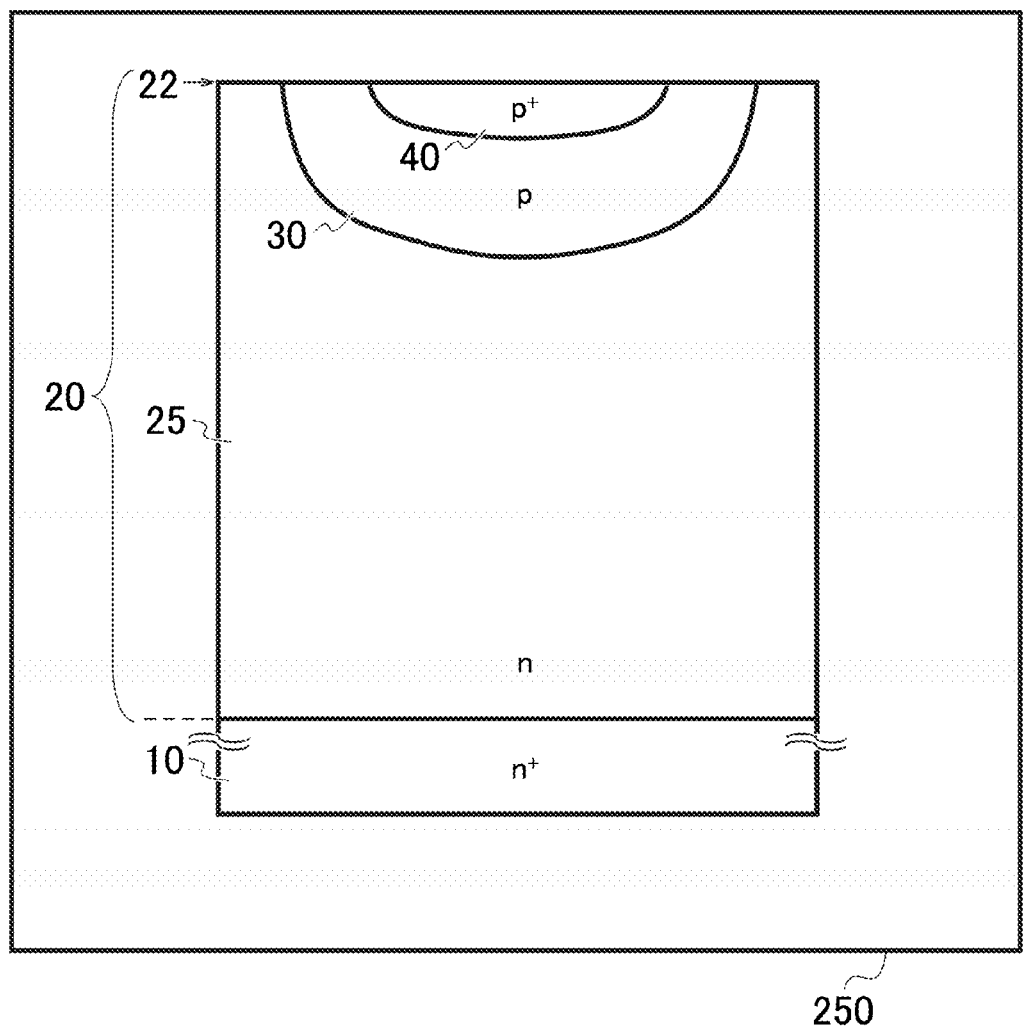
FIG. 5E shows step S50.

FIG. 5E shows step S50. In step S50, the GaN layer 20 is annealed in an annealing furnace 250 at a temperature greater than or equal to 1,300 [° C.] and less than or equal to 1,500 [° C.]. In step S50, the annealing furnace 250 may be filled with an N₂ (nitrogen) or NH₃ (ammonia) atmospheric gas. The pressure of the atmospheric gas may be from 0.1 [MPa] to 1,000 [MPa]. Instead of or in addition to this atmospheric gas, an AlN (aluminum nitride) layer may be provided as a cap layer on the front surface 22. The atmospheric gas and the cap layer have a function to restrict breakdown of the GaN material and release of N. The p-type well region 30 and the p⁺-type well region 40 are formed by annealing.

Figure 5F:
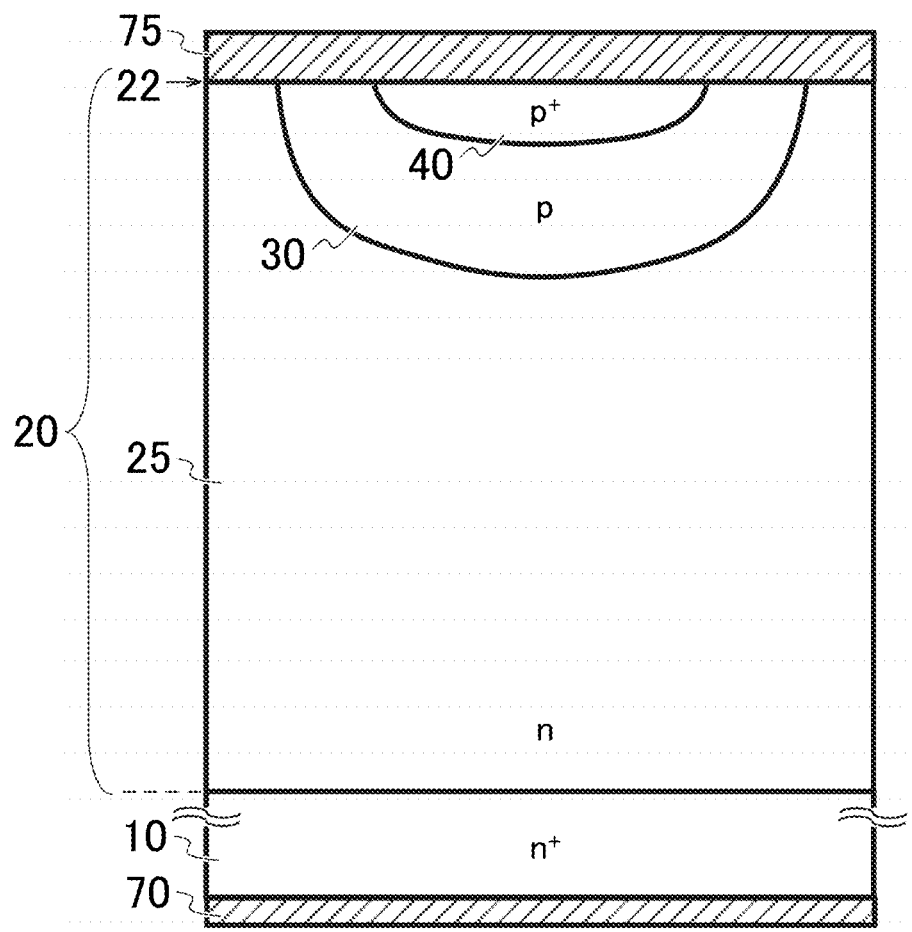
FIG. 5F shows step S60.

FIG. 5F shows step S60. In step S60, the anode electrode 75 and the cathode electrode 70 described in relation to FIG. 3A are each formed using sputtering or the like. In this way, the JBS diode 100 of FIG. 3A is completed.

Figure 6:
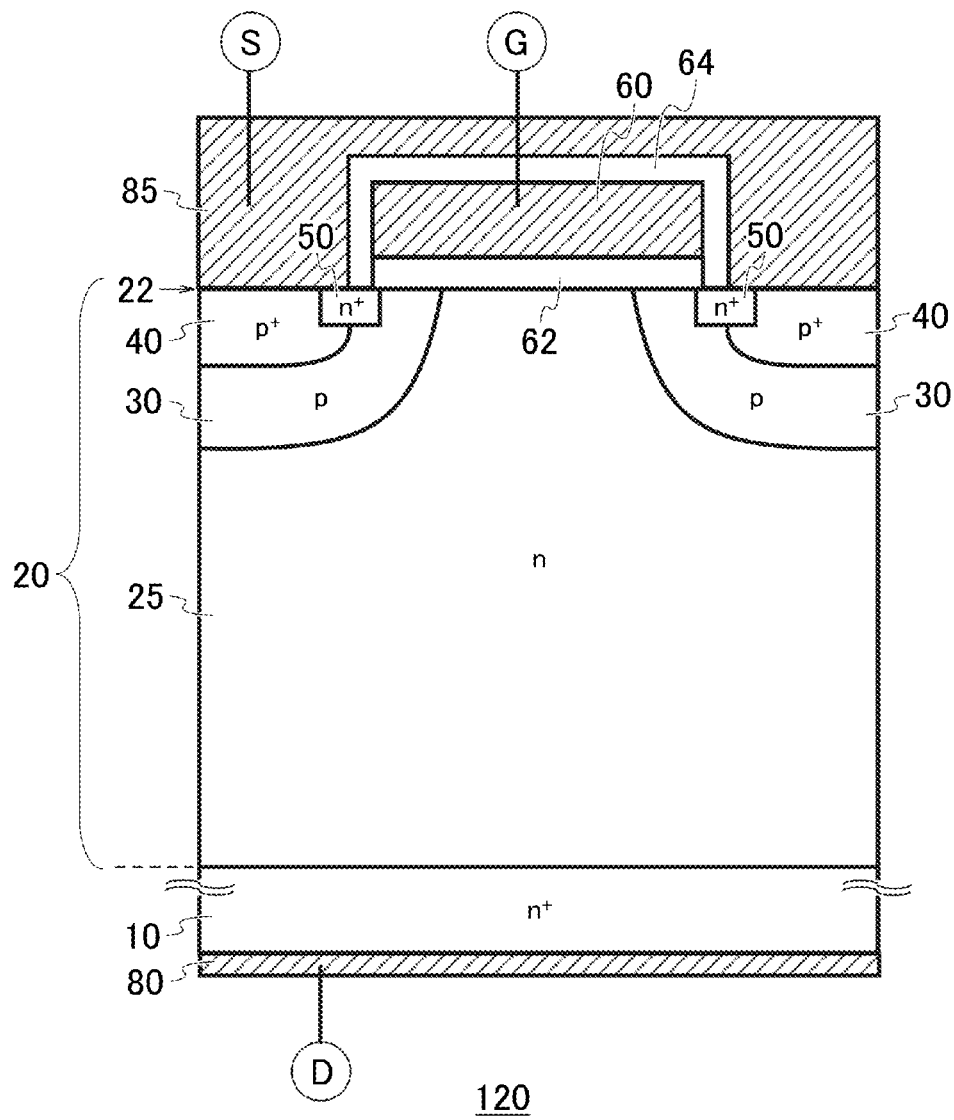
FIG. 6 shows a cross section of essential portions of a MOSFET 120 according to a second embodiment.

FIG. 6 shows a cross section of essential portions of a MOSFET 120 according to a second embodiment. The n⁺-type GaN substrate 10, the n-type region 25, the p-type well region 30, and the p⁺-type well region 40 of the MOSFET 120 in the present example can be formed using the same techniques as in the JBS diode 100. Therefore, these components in the MOSFET 120 are given the same reference numerals as in the JBS diode 100 and descriptions thereof are omitted.

The MOSFET 120 in the present embodiment is a so-called vertical MOSFET. The n-type region 25 is positioned between the two p-type well regions 30 in FIG. 6. The MOSFET 120 includes an n⁺-type source region 50 between the p-type well regions 30 and the p⁺-type well regions 40 near the front surface 22. The portion of the p-type well regions 30 between the n⁺-type source region 50 and the n-type region 25 and below the gate electrode 60 functions as a channel formation region.

The MOSFET 120 includes a gate insulating film 62 at least on the n-type region 25 and the channel formation region. The gate insulating film 62 may be SiO₂ (silicon oxide). The MOSFET 120 includes a gate electrode on the gate insulating film 62. The gate electrode 60 may be poly-Si (polysilicon).

The MOSFET 120 includes a source electrode 85 that is electrically connected to the n⁺-type source region 50 and the p⁺-type well region 40. The source electrode 85 may be made of a different material than the n⁺-type source region 50 and the p⁺-type well region 40. The source electrode 85 may include a layered body of Ti and Al on the n⁺-type source region 50, and may include Ni, Pd (palladium), or Pt on the p⁺-type well region 40. Furthermore, the MOSFET 120 includes an interlayer insulating film 64 that electrically insulated the gate electrode 60 from the source electrode 85. The interlayer insulating film 64 may be SiO₂. Furthermore, the MOSFET 120 includes a drain electrode 80 below the n⁺-type GaN substrate 10. The drain electrode 80 may be a layered body of Ti and Al, in the same manner as the cathode electrode 70 of the JBS diode 100.

The gate terminal, the drain terminal, and the source terminal are respectively indicated by an encircled G, D, and S. In a case where the drain electrode 80 has a prescribed high potential and the source electrode 85 has a ground potential, when a potential greater than or equal to the threshold voltage of the gate electrode 60 is applied, a charge inversion layer is formed in the channel formation region and current flows from the drain terminal to the source terminal.

Figure 7:
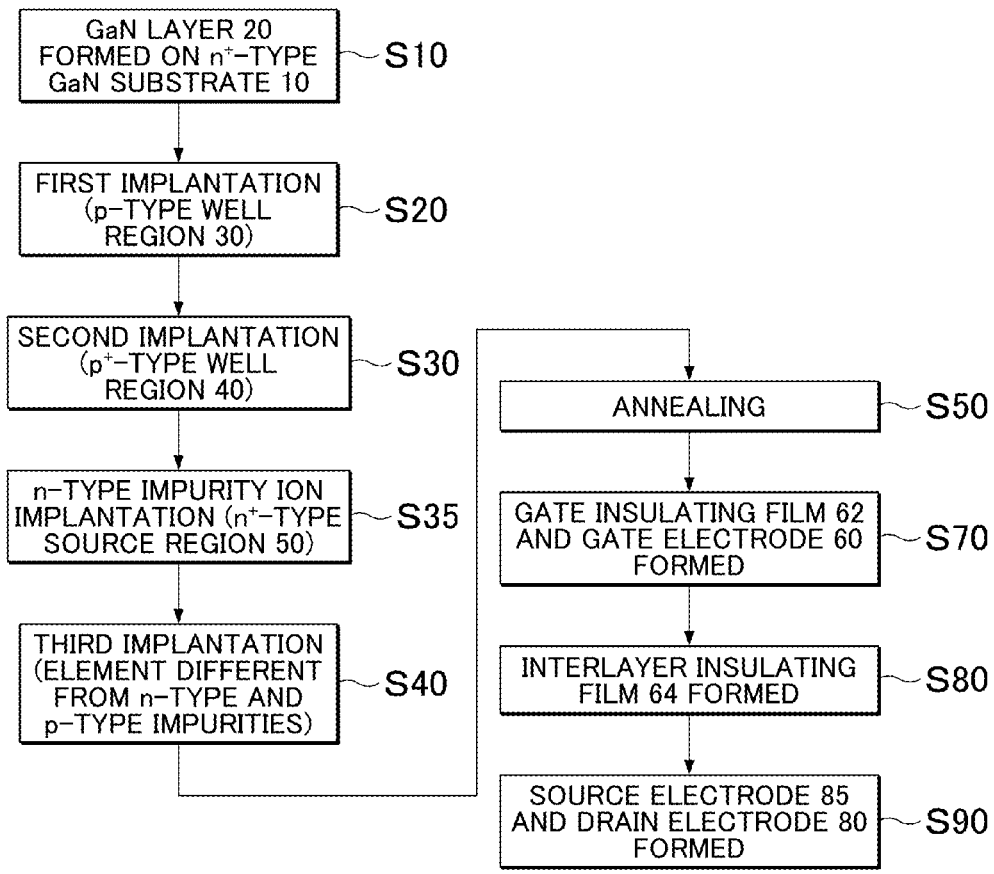
FIG. 7 shows a manufacturing method 220 of the MOSFET 120.

FIG. 7 shows a manufacturing method 220 of the MOSFET 120. In the present example, step S10 to S90 are performed in this order. In the same manner as in the example of FIG. 4, step S40 of implanting an element different from the n-type impurities and the p-type impurities from the front surface 22 of the GaN layer 20 may be performed as desired.

The following describes the differences relative to the example of FIG. 4. The manufacturing method 220 includes step S35 between step S30 and step S40. In step S35, n-type impurities are ion-implanted from the front surface 22 of the GaN layer 20 through openings in a prescribed resist mask.

In the present example, Si is ion-implanted with acceleration voltages of 30, 60, and 80 [keV] and a dose amount of 3E+15 [cm$^2$]. In this way, the n$^+$-type source region 50 with an impurity concentration of 1E+20 [cm$^{-3}$] is provided in the GaN layer 20 after the annealing of step S50.

The manufacturing method 220 includes steps S70 to S90 instead of step S60 of FIG. 4. In step S70, the gate insulating film 62 and the gate electrode 60 are each formed using CVD deposition and patterning. In step S80, the interlayer insulating film 64 is formed using CVD deposition and patterning. In step S90, the source electrode 85 and the drain electrode 80 are each formed using sputtering deposition.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: n$^+$-type GaN substrate 10, 20: GaN layer, 22: front surface, 25: n-type region, 27: depletion layer, 30: p-type well region, 35: flat region, 40: p$^+$-type well region, 42: defect region, 45: peak region, 47: peak position, 50: n$^+$-type source region, 60: gate electrode, 62: gate insulating film, 64: interlayer insulating film, 70: cathode electrode, 75: anode electrode, 80: drain electrode, 85: source electrode, 90: resist mask, 92: resist mask, 95: opening, 97: opening, 100: JBS diode, 120: MOSFET, 200: manufacturing method, 220: manufacturing method, 250: annealing furnace, 300: JBS diode

What is claimed is:

1. A semiconductor device using gallium nitride, comprising a gallium nitride layer including an n-type region, wherein the gallium nitride layer includes:
   a first p-type well region;
   a second p-type well region that is provided on at least a portion of the first p-type well region and has a peak region with a higher p-type impurity concentration than the first p-type well region; and
   a defect region formed on a surface of the second p-type well region.

2. The semiconductor according to claim 1, wherein the peak region in the second p-type well region has a p-type impurity concentration greater than or equal to 1E+19 [cm$^{-3}$].

3. The semiconductor according to claim 1, wherein the peak region in the second p-type well region has a p-type impurity concentration less than 1E+21 [cm$^{-3}$].

4. The semiconductor device according to claim 1, wherein
the first p-type well region includes a flat region in which a slope of a p-type impurity concentration distribution in a depth direction of the gallium nitride layer is more gentle than a slope of a p-type impurity concentration distribution of the peak region, and
the flat region has a p-type impurity concentration less than 1E+19 [cm$^{-3}$].

5. The semiconductor device according to claim 1, wherein
the flat region in the first p-type well region has a p-type impurity concentration greater than or equal to 1E+16 [cm$^{-3}$].

6. The semiconductor device according to claim 4, wherein
a largest value of the p-type impurity concentration of the flat region in the first p-type well region is less than or equal to half of the p-type impurity concentration of the peak region in the second p-type well region.

7. The semiconductor device according to claim 1, wherein
when an anode potential applied to the second p-type well region is less than a cathode potential applied to the n-type region, a depletion layer formed between the first p-type well region and the n-type region does not reach the second p-type well region.

8. The semiconductor device according to claim 7, wherein
when a critical voltage, which is a difference between the anode potential and the cathode potential when an avalanche breakdown occurs in the gallium nitride layer, is applied, the depletion layer does not reach the second p-type well region.

9. The semiconductor device according to claim 1, wherein
the number of lattice defects in the second p-type well region is greater than the number of lattice defects in the first p-type well region.

10. The semiconductor device according to claim 1, wherein
the p-type impurities of the first p-type well region and the second p-type well region include one or more types of elements from among magnesium, calcium, beryllium, and zinc.

11. The semiconductor device according to claim 1, wherein
the gallium nitride layer has a dislocation density less than 1E+7 [cm$^{-3}$].

12. The semiconductor according to claim 1, wherein the defect region is formed by implanted nitrogen.

13. The semiconductor according to claim 1, wherein the defect region is formed by implanted argon.

14. The semiconductor according to claim 1, wherein the defect region is formed to a shallower depth than a depth of a peak of the p-type impurity concentration in the second p-type well region.

15. The semiconductor according to claim 1, wherein
a depth of the first p-type well region is between 300 nm and 500 nm; and
a depth of the second p-type well region is between 10 nm and 100 nm.

16. The semiconductor according to claim 1, wherein
an alloy region formed by a reaction between the second p-type well region and an anode electrode occupies a depth of at most 50 nm downward from the front surface of the second p-type well region.

* * * * *